US008842859B2

(12) United States Patent
Delaus et al.

(10) Patent No.: US 8,842,859 B2
(45) Date of Patent: Sep. 23, 2014

(54) PACKAGED MICROPHONE WITH REDUCED PARASITICS

(75) Inventors: Michael D. Delaus, Andover, MA (US); Kathleen O'Donnell, Arlington, MA (US)

(73) Assignee: Invensense, Inc., San Jose, CA (US)

( * ) Notice: Subject to any disclaimer, the term of this patent is extended or adjusted under 35 U.S.C. 154(b) by 63 days.

(21) Appl. No.: 13/357,158

(22) Filed: Jan. 24, 2012

(65) Prior Publication Data

US 2012/0189144 A1 Jul. 26, 2012

Related U.S. Application Data

(60) Provisional application No. 61/435,469, filed on Jan. 24, 2011.

(51) Int. Cl.
*H04R 25/00* (2006.01)
*B81C 1/00* (2006.01)

(52) U.S. Cl.
CPC ..... *B81C 1/0023* (2013.01); *H01L 2224/48137* (2013.01); *H01L 2224/48091* (2013.01); *H01L 2224/73265* (2013.01); *B81B 2201/0257* (2013.01); *H01L 2924/10253* (2013.01)
USPC ........... 381/175; 381/355; 381/360; 381/361; 174/262

(58) Field of Classification Search
USPC .................. 381/355, 360, 361, 175; 174/262
See application file for complete search history.

(56) References Cited

U.S. PATENT DOCUMENTS

| | | | |
|---|---|---|---|
| 5,101,665 A * | 4/1992 | Mizuno | 73/721 |
| 5,545,912 A * | 8/1996 | Ristic et al. | 257/417 |
| 6,324,907 B1 * | 12/2001 | Halteren et al. | 73/431 |
| 6,781,231 B2 * | 8/2004 | Minervini | 257/704 |
| 7,808,060 B2 * | 10/2010 | Hsiao | 257/416 |
| 2006/0034472 A1 * | 2/2006 | Bazarjani et al. | 381/111 |
| 2007/0205499 A1 | 9/2007 | Wang et al. | 257/704 |
| 2007/0210392 A1 | 9/2007 | Sakakibara et al. | 257/414 |
| 2008/0130935 A1 * | 6/2008 | Sato et al. | 381/361 |
| 2008/0219482 A1 * | 9/2008 | Sato | 381/174 |
| 2010/0080405 A1 | 4/2010 | Wu et al. | 381/174 |

(Continued)

OTHER PUBLICATIONS

International Searching Authority, International Search Report—International Application No. PCT/US2012/022359, dated Jul. 3, 2012, together with the Written Opinion of the International Searching Authority, 9 pages.

(Continued)

*Primary Examiner* — Curtis Kuntz
*Assistant Examiner* — Ryan Robinson
(74) *Attorney, Agent, or Firm* — Maryam Imam; IPxLaw Group LLP

(57) ABSTRACT

A packaged microphone has a base with a top face, a lid coupled to the base and forming an interior, and a MEMS microphone (i.e., a die or chip) secured to the top face of the base within the interior. The packaged microphone also includes a circuit chip secured to the top face of the base within the interior. The circuit chip has a top surface with a top pad, a bottom surface with a bottom pad, and a via. The bottom pad is electrically connected to the base, and the via electrically connects the top pad with the bottom pad. A wire bond is connected between the MEMS microphone and the top pad on the circuit chip. The MEMS microphone is electrically connected to the bottom pad and the base through the via.

36 Claims, 3 Drawing Sheets

(56) References Cited

U.S. PATENT DOCUMENTS

2010/0086164 A1     4/2010   Gong et al. .................. 381/369
2011/0115064 A1*   5/2011   Radojcic et al. ............. 257/686
2011/0293126 A1*   12/2011   Maekawa et al. ............ 381/355

OTHER PUBLICATIONS

Prismark Partners LLC, "The Prismark Wireless Technology Report," Prismark Partners LLC, Mar. 2005, 27 pages.

* cited by examiner

PACKAGED MICROPHONE WITH REDUCED PARASITICS

PRIORITY

This patent application claims priority from provisional U.S. patent application Ser. No. 61/435,469, filed Jan. 24, 2011 entitled, "PACKAGED MICROPHONE WITH REDUCED PARASITICS," and naming Michael D. Delaus and Kathleen O'Donnell as inventors, the disclosure of which is incorporated herein, in its entirety, by reference.

TECHNICAL FIELD

The invention generally relates to microphones and, more particularly, the invention relates to MEMS microphones.

BACKGROUND ART

MEMS microphones typically are secured within a package to protect them from the environment. Many such packages often have a base for supporting the microphone, and a lid secured to the base forming an interior. An integrated circuit chip, also mounted within the package interior, processes electrical signals to and from the microphone. One or more apertures through some portion of the package permit audio signals to reach the microphone. Receipt of the audio signal causes the microphone, with its corresponding integrated circuit chip, to produce an electronic signal representing the audio qualities of the received signal.

The microphones and their corresponding integrated circuit chips often use wire bonds to electrically connect with the base. Undesirably, this technique increases the footprint of the overall packaged microphone.

SUMMARY OF VARIOUS EMBODIMENTS OF THE INVENTION

In accordance with illustrative embodiments of the invention, a packaged microphone has a base with a top face, a lid coupled to the base and forming an interior, and a MEMS microphone (i.e., a die or chip) secured to the top face of the base within the interior. The packaged microphone also includes a circuit chip secured to the top face of the base within the interior. The circuit chip has a top surface with a top pad, a bottom surface with a bottom pad, and a via. The bottom pad is electrically connected to the base, and the via electrically connects the top pad with the bottom pad. A wire bond is connected between the MEMS microphone and the top pad on the circuit chip. The MEMS microphone is electrically connected to the bottom pad and the base through the via.

In some embodiments, the lid and base form an interior area on the top face of the base, and the circuit chip forms 1) a circuit chip area (i.e., part of the interior area) underneath the circuit chip and 2) a remaining area. The remaining area thus is the rest of the interior area other than the circuit chip area. The remaining area illustratively is substantially free of traces.

The microphone and circuit chip may cover more than about 70 percent of the interior area (e.g., more than about 75 percent, 80 percent, 85 percent, or 90 percent). In some embodiments, no wire bonds extend directly from the top face of the base and the MEMS microphone. The MEMS microphone also may electrically connect to the base through the wire bond only.

Among other things, circuitry may be positioned on the top surface of the circuit chip. In addition to the via noted above, the circuit chip also may include a plurality of additional vias extending between the top surface and bottom surface of the circuit chip. In some embodiments, the circuit chip and MEMS microphone form a plan region that is generally parallel to the base. The plan region has a space between the circuit chip and MEMS microphone, and the wire bond is within the plan region only.

In accordance with other embodiments of the invention, a packaged microphone has a base, a lid coupled to the base forming an interior, and a MEMS microphone secured to the base within the interior. The packaged microphone also has a circuit chip, within its interior, having a via and a pad. The via is electrically connected to the base and the pad. A wire bond electrically connects between the MEMS microphone and the pad on the circuit chip, thus electrically connecting the MEMS microphone to the base through the via.

Illustrative embodiments surface mount the circuit chip to the base. Among other things, the base may include printed circuit board material, and/or the lid may include conductive material. The lid and base thus may form at least a partial electromagnetic shield about the interior.

The pad may be located on the top surface of the circuit chip and connected to the wire bond. Moreover, one or both the lid and base may form an aperture for receiving an input audio signal. The microphone thus may be mounted in any of a number of different locations relative to the aperture. For example, the microphone can substantially cover the aperture.

Various embodiments reduce the footprint of the overall microphone system and mitigate parasitic capacitance from interconnects between the microphone and the base. To that end, the MEMS microphone may electrically connect to the base through the wire bond only.

In accordance with another embodiment of the invention, a method mounts a MEMS microphone onto a base formed from circuit board material, and surface mounts an integrated circuit chip onto the base. The integrated circuit has a top surface, a bottom surface, and a via extending between the top and bottom surfaces. The via electrically connects to the base through its surface mount connection, while the via forms a pad on the top surface. The method also connects a wire bond between the MEMS microphone and the pad on the top surface of the integrated circuit chip, and secures a lid to the base.

The integrated circuit chip and MEMS microphone may be considered to form a plan region that is generally parallel to the substrate. This plan region also includes a space between the integrated circuit chip and MEMS microphone. Thus, to reduce the device footprint, illustrative embodiments ensure that the wire bond is within the plan region only.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a packaged microphone is configured to effectively reduce its footprint and mitigate electromagnetic interference produced through the electrical connections between its components. To those ends, the packaged microphone has a package base supporting both an integrated circuit chip and a microphone chip. The circuit chip has at least one via through which both it and the microphone chip communicate with the base. To that end, one or more wire bonds electrically connect the microphone chip to the base through the circuit chip via. Accordingly, no circuit traces are necessary on the surface of the base, thus eliminating a potential source of electromagnetic interference. This connection also favorably reduces the amount of real estate required for the package base. Details of illustrative embodiments are discussed below.

Figure 1:
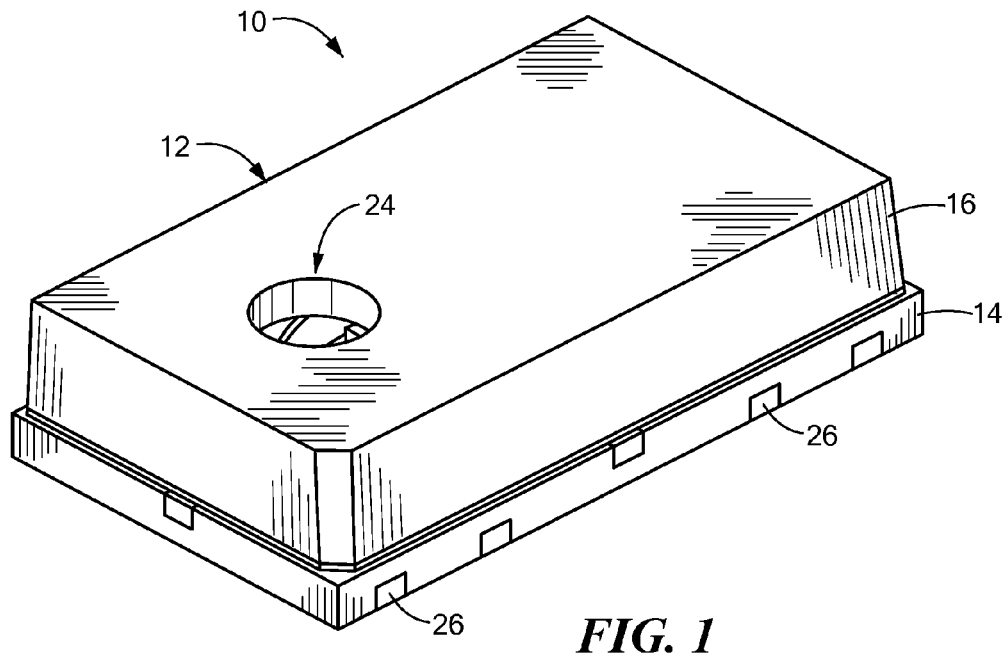
FIG. 1 schematically shows a perspective view of a packaged microphone that may be configured in accordance with illustrative embodiments of the invention.

FIG. 1 schematically shows a packaged microphone 10 implemented in accordance with illustrative embodiments of the invention. The packaged microphone 10 has a package 12 that may be coupled with an underlying apparatus, such as a printed circuit board. The underlying apparatus, however, can comprise any of a variety of other devices. Accordingly, discussion of a printed circuit board is illustrative and not intended to limit a variety of other embodiments.

The package 12 has a base 14 that, together with a corresponding lid 16, forms an interior chamber 18 containing a MEMS/silicon microphone chip 20 and circuit chip 22. The primary function of the circuit chip 22 is to control and manage input to and output from the microphone chip 20. For example, among other things, a circuit chip 22 may amplify varying capacitance signals produced by the microphone chip 20, and control the voltage applied to the microphone chip 20. In illustrative embodiments, the circuit chip 22 is implemented as an application specific integrated circuit, which is also known as an "ASIC."

Because microphones can be susceptible to radio frequency interference, or electromagnetic interference (EMI), the package 12 preferably incorporates noise reducing technology. Accordingly, illustrative embodiments effectively form a Faraday cage around the microphone in any of a number of different manners. To that end, the lid 16 in the embodiments shown is a cavity-type, solid metal lid, which has four walls extending generally orthogonally from a top, interior face to form a cavity. As solid metal, the lid 16 does not require a metal coating on a plastic or other base material. Instead, illustrative embodiments form the lid 16 from a piece of metal, such as a piece of sheet metal. For example, in illustrative embodiments, the lid 16 is a formed metal lid having a generally cup-shaped concavity defining a part of the package chamber 18. The lid 16 secures to the top face of the substantially flat package base 14 to form the interior chamber 18.

Other types of metal lids may be used. For example, the lid 16 may be flat and coupled to upwardly projecting walls extending from the base 14. Alternatively, the lid 16 may be formed from a non-conductive material, with or without a conductive layer, such as metal. The lid 16 also has an audio input port 24 (also referred to as an aperture 24) that enables ingress of audio signals into the chamber 18. In alternative embodiments, however, the audio port 24 is at another location, such as through another portion of the top face of the lid 16, the side of the lid 16, or even through the base 14.

Conventional techniques connect the lid 16 to the base 14. For example, after mounting the microphone 18 and its corresponding ASIC to the base 14, conventional fabrication processes can connect the lid 16 to the base 14 with an adhesive. As known by those skilled in the art, a difference in the potential between the lid 16 and base 14 undesirably can interfere with movement of the diaphragm 32. Accordingly, conductive adhesive preferably is used to ensure that the lid 16 has the same potential as prescribed portions of the base 14. To that end, the base 14 may have a bond pad that directly contacts the lid to provide such a same potential.

Audio signals entering the interior chamber 18 interact with the microphone chip 20 and, consequently, the circuit chip 22, to produce an electrical signal. The bottom face of the package base 14 has a number of external contacts/bond pads 26 for electrically (and physically, in many anticipated uses) connecting the microphone system 10 with an external apparatus (not shown but noted above), such as a printed circuit board or other electrical interconnect apparatus. In illustrative embodiments, the package 12 is surface mounted to the circuit board. Accordingly, during use, the microphone chip 20 and circuit chip 22 cooperate to convert audio signals received through the aperture 24 into electrical signals, and route those signals through external contacts/bond pads 26 in the base 14 to the circuit board.

In illustrative embodiments, the package base 14 is formed from an electrical interconnect apparatus, such as a ceramic package material, carrier, printed circuit board material (e.g., using alternating layers of FR-4 or a BT-resin/epoxy laminate-type material). Other types of packages may be used, however, such as premolded, leadframe-type packages (also referred to as a "premolded package"). As suggested above, the base 14 may be a cavity package, or a flat-type package.

Figure 2:
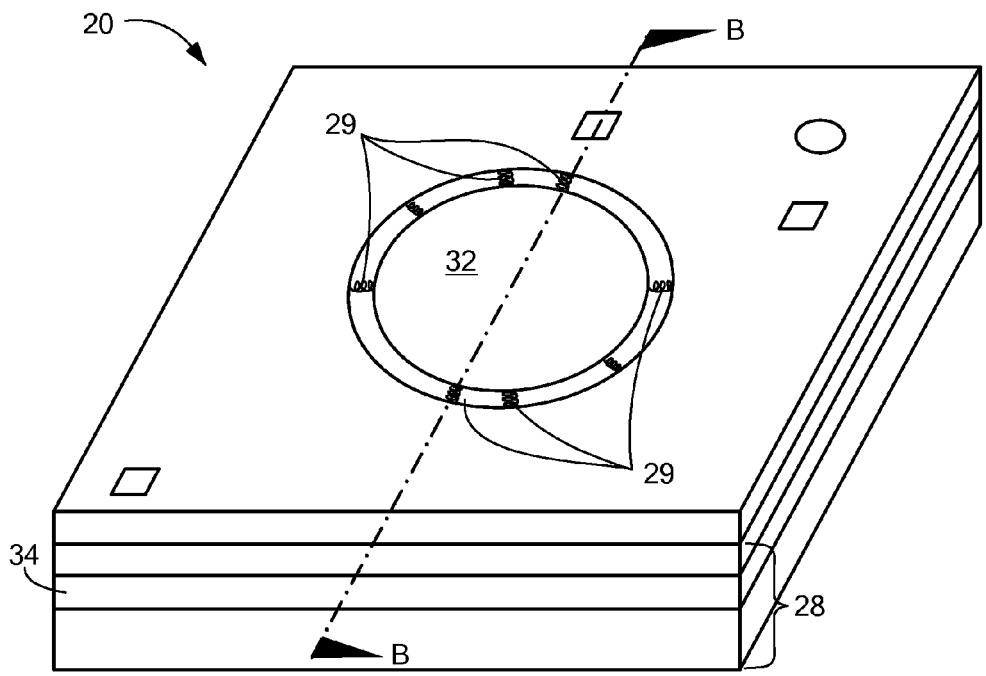
FIG. 2 schematically shows a perspective view of a MEMS microphone that may be used with illustrative embodiments of the invention.
Figure 3:
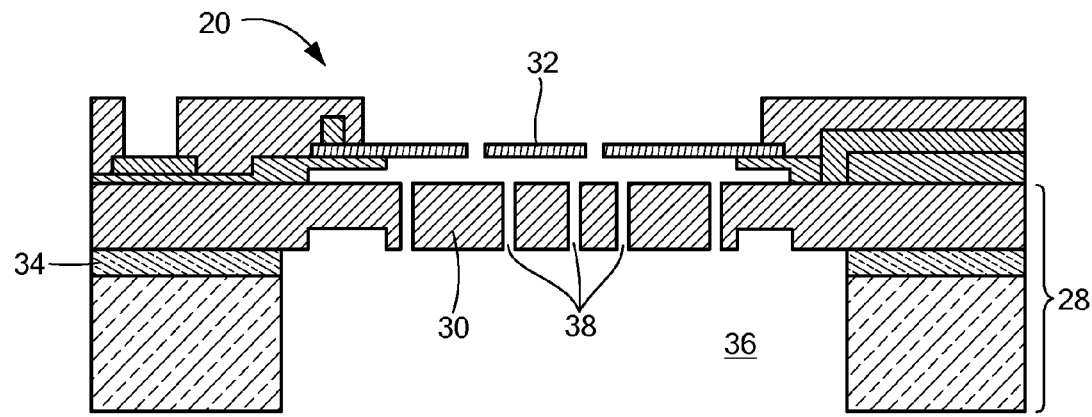
FIG. 3 schematically shows a cross-sectional view of the MEMS microphone shown in FIG. 2.

FIG. 2 schematically shows a top, perspective view of a MEMS microphone chip 20 that may be used with illustrative embodiments of the invention. FIG. 3 schematically shows a cross-sectional view of the same MEMS microphone chip 20. These two figures are discussed simply to detail some exemplary components that may make up a microphone used in accordance with various embodiments. As shown in FIGS. 2 and 3, the microphone chip 20 has a chip base/substrate 28, one portion of which supports a suspended backplate 30. The microphone 10 also includes a flexible diaphragm 32 that is suspended by springs 29 over, and movable relative to, the backplate 30. The backplate 30 and diaphragm 32 together form a variable capacitor. In illustrative embodiments, the backplate 30 is formed from single crystal silicon (e.g., a part of a silicon-on-insulator wafer), while the diaphragm 32 is formed from deposited polysilicon. In other embodiments, however, the backplate 30 and diaphragm 32 may be formed from different materials.

In the embodiment shown in FIG. 2, the substrate 28 includes the backplate 30 and other structures, such as a bottom wafer and a buried oxide layer 34 of an SOI wafer. A portion of the substrate 28 also forms a backside cavity 36 extending from the bottom of the substrate 28 to the bottom of the backplate 30. To facilitate operation, the backplate 30 has a plurality of through-holes 38 that lead to the backside cavity 36.

It should be noted that various embodiments are sometimes described herein using words of orientation such as "top," "bottom," or "side." These and similar terms are merely employed for convenience and typically refer to the perspective of the drawings. For example, the substrate 28 is below the diaphragm 32 from the perspective of FIG. 2. However, the substrate 28 may be in some other orientation relative to the diaphragm 32 depending on the orientation of the MEMS microphone 10. Thus, in the present discussion, perspective is based on the orientation of the drawings of the MEMS microphone 10.

In operation, audio signals strike the diaphragm 32, causing it to vibrate, thus varying the distance between the diaphragm 32 and the backplate 30 to produce a changing capacitance. Such audio signals may contact the microphone 10 from any direction. For example, the audio signals may travel upward, first through the backplate 30, and then partially through and against the diaphragm 32. In other embodiments, the audio signals may travel in the opposite direction.

Conventional on-chip or off-chip circuitry (e.g., the ASIC, shown in FIGS. 4-5) converts this changing capacitance into electrical signals that can be further processed. It should be noted that discussion of the specific microphone 20 is for illustrative purposes only. Other microphone configurations thus may be used with illustrative embodiments of the invention. For example, rather than using an SOI wafer, the microphone 20 may be formed from a bulk silicon wafer substrate.

Figure 4:
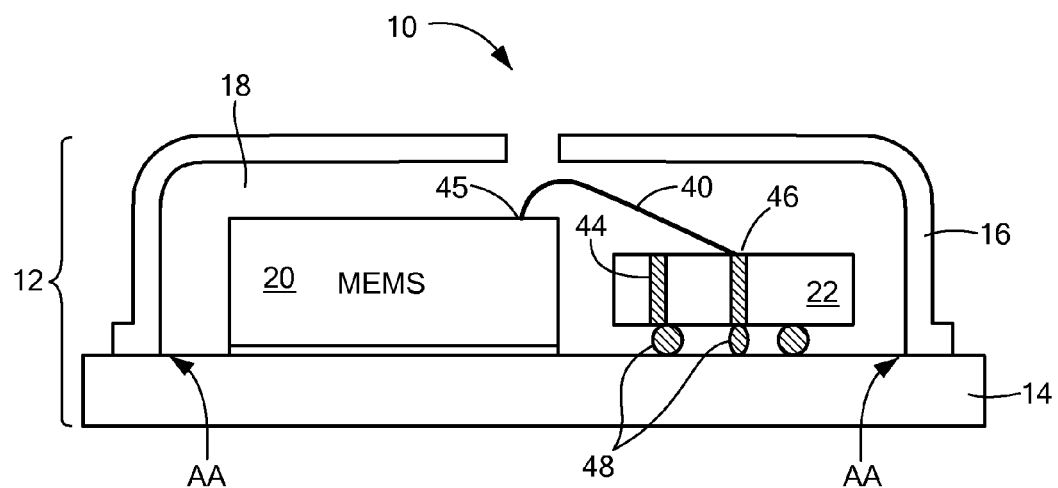
FIG. 4 schematically shows a cross-sectional view of the packaged microphone shown in FIG. 1.
Figure 5:
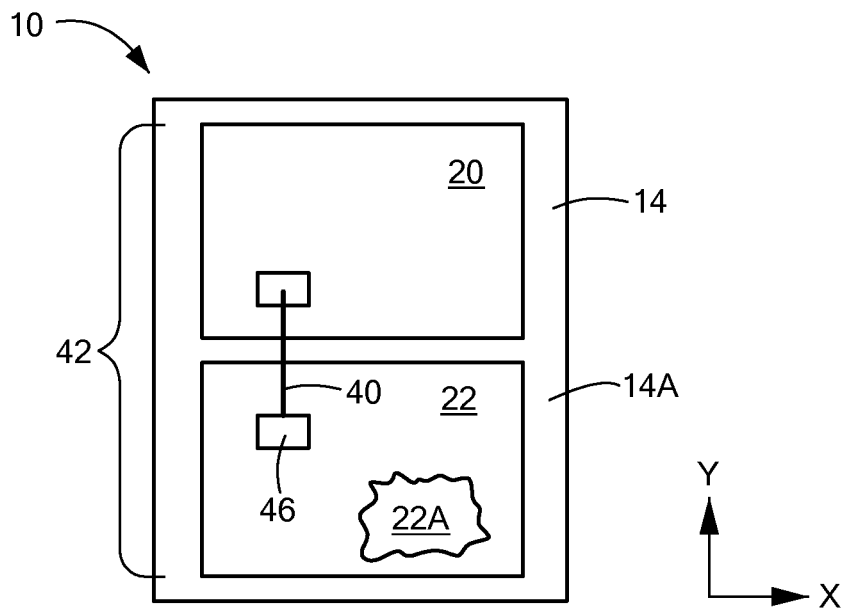
FIG. 5 schematically shows a top view of the packaged microphone of FIG. 1 with the lid removed.

FIG. 4 schematically shows a cross-sectional view of the packaged microphone 10 of FIG. 1. The ASIC/circuit chip 22 and the microphone chip 20 preferably are closely positioned within the package interior and electrically connected with a wire bond 40. As shown in FIG. 5, which shows a top view of the microphone with the lid 16 removed, the wire bond 40 extends between bond pads on the ASIC chip 22 and the microphone chip 20.

With reference to FIGS. 4 and 5, the lid 16 and base 14 are considered to form an interior area 14A on the top surface of the base 14. This interior area 14A is bounded by the inner face of the lid 16 and the top surface of the base 14. Specifically, the interior area 14A begins at the region where the interior chamber 18 begins (identified by example in FIG. 4 by arrows "AA") to form the perimeter of this region 14A. This entire interior area 14A may be considered to include a circuit chip area 22A, which is directly underneath the circuit chip 22, and a remaining area, which is the entire interior area 14A that is not part of the circuit chip area 22A. The MEMS microphone 20 thus is positioned on the remaining area, as is the area not covered by the circuit chip 22.

The area covered by the MEMS microphone 20 and circuit chip area 22A may take up most of the total interior area 14A. For example, the MEMS microphone 20 and circuit chip 22 may be mounted over more than half of the total interior area 14A (e.g., more than about 70 percent, 75 percent, 80 percent, 85 percent, or 90 percent). Accordingly, this should significantly reduce the footprint of the overall package. In illustrative embodiments, the remaining area has no circuit traces (i.e., no metal transmission lines in the remaining area)—in other words, the remaining area is free of circuit traces. As discussed in detail below, this should reduce parasitic capacitance concerns and the overall footprint of the packaged microchip 10.

The two chips 20 and 22 may be considered to form a plan region 42 that is bounded by the outside boundary of the two chips 20 and 22, and the area directly between the two chips 20 and 22. Using FIG. 5 as an example, this plan region 42 is generally rectangular (although it can be other shapes depending on the chips 20 and 22) and, in plan view, generally parallel with the top surface of the base 14. In other words, the plan region 42 is bounded by the perimeter of the two chips 20 and 22, and the space between both chips 20 and 22. In accordance with illustrative embodiments, when viewed in plan view as in FIG. 5, the wire bond 40 is contained within this plan region 42—it does not extend beyond that region 42.

This is in contrast to prior art packaged microphones known to the inventors, which, when wire bonding directly to the base 14, require the region outside of the plan region 42 to accommodate the wire bond 40. Thus, because it is not required to be sized to accommodate the wire bond 40, the interior region outside of the plan region 42 can be much smaller, consequently reducing the overall required footprint of the package. In other words, mounting the wire bond 40 only within the plan region 42 eliminates the need to enlarge the overall area of the interior region because the area outside of the plan region does not need to be sized to contain the wire bond 40.

Some embodiments may have a plurality of wire bonds 40 that all remain within this plan area. Alternative embodiments, however, may have a plurality of wire bonds 40 with one or more outside of this region. In any case, those skilled in the art thus should understand that maintaining the wire bond 40 in this region eliminates the need to enlarge the base 14 in the base area outside of the plan region 42. As such, the overall footprint of the package 12 can be smaller than those with wire bonds outside of the plan region 42. For example, for order of magnitude, the inventors believe that one implementation of the package 12 can have a size of about 3 mm length×2 mm width×1 mm thickness.

To facilitate this, the microphone chip 20 illustratively communicates with the base 14 through this set of wire bonds 40 only. In other words, the microphone chip 20 has no other means of communicating with the base 14 (and ultimately an exterior device) other than through the circuit chip 22. To that end, in accordance with illustrative embodiments of the invention, the circuit chip 22 has one or more conductive through silicon vias 44 (referred to generally as a "vias 44" or "TSV 44") between its top and bottom surfaces. More specifically, each via 44 extends from a top pad 46 on the top surface of the circuit chip 22 to a bottom pad 48 on its bottom surface. The wire bond 40 thus is connected (e.g., using a thermal compression process) to the top pad 46 of the circuit chip 22, and a corresponding pad 45 on the microphone chip 20.

In a corresponding manner, the bottom pad 48 of the circuit chip 22 is surface mounted to the base 14 in a conventional manner. For example, solder may directly electrically and mechanically connect the bottom pad 48 to a corresponding bonding site or pad on the base 14. It should be noted that the circuit chip 22 may be mounted to the base 14 in another manner. Accordingly, discussion of a specific mounting technique, to either pad, is for illustration only.

The circuitry thus can be located on the top surface of the circuit chip 22 from the perspective of FIG. 4 (which is typical). Accordingly, this arrangement is not a so-called "flip-chip" connection. Alternative embodiments, however, may form some circuitry on the bottom side. For example, the circuit chip 22 could be mounted with the surface having at least part of the circuit facing downwardly. Some such embodiments still may have much of the circuit on the so-called "top side," however, which, as known by those in the art, is the top side of the wafer during the integrated circuit fabrication process. Certain principles of illustrative embodiments should also apply to those embodiments.

The via 44 thus provides a number of benefits. Without it, to connect the microphone chip 20 with the circuit chip 22, one skilled in the art may need to run a metal trace along the top surface of the base 14 to the bottom pad 48 of the circuit chip 22. This trace then would connect with a wire bond from the microphone chip 20. A wire bond and trace used in this manner undesirably can create a parasitic capacitance. As known by those in the art, MEMS microphones are particularly sensitive to such capacitances. The via 44 eliminates that problem because it eliminates the trace.

In addition, the via 44 enables the wire bond 40 to connect directly to it through the top pad 46, thus permitting the beneficial wire bond connection between the chips 20 and 22, reducing the overall footprint of the package 12. It should be noted that the via 44 may connect with circuitry on the circuit chip 22, or simply be a direct, uninterrupted electrical path to the base 14 (e.g., for the microphone 20 alone). Illustrative embodiments thus do not have a wire bond extending from the microphone chip 20 directly to the base 14. The wire bond 40, which is connected to the circuit chip 22, therefore is the only means of electrical connection between the microphone chip 20 and the base 14. Alternative embodiments, however, may have other wire bonds connected to the base.

Figure 6:
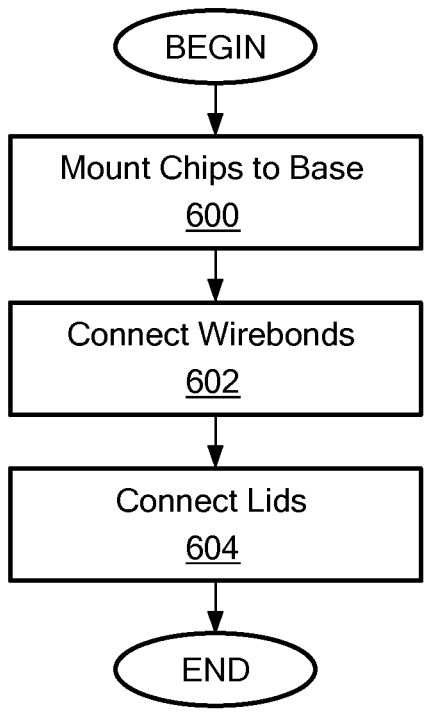
FIG. 6 shows a process of assembling the packaged microphone of FIG. 1.

FIG. 6 shows a processes of assembling the packaged microphone 10 as shown in FIG. 1. It should be noted that although this process refers to forming a single packaged microphone, those skilled in the art can expand it to cover batch packaging processes. Such batch processes can form two dimensional arrays of packaged microphones substantially simultaneously, and complete the process with a cutting/dicing operation to produce multiple individual packaged microphones, such as that shown in FIG. 1. Moreover, the process merely highlights several of many steps that actually take place in a package assembly process. FIG. 6 thus omits some steps (e.g., testing steps) that those skilled in the art understand may take place.

The process begins at step 600, which mounts the two chips 20 and 22 to the base 14. To that end, the process may secure the microphone 20 onto a non-conductive portion of the top face of the base 20 using adhesive or other securing means. In illustrative embodiments, this position is in close proximity to the aperture 24. For example, if the aperture 24 is formed through the base 14, the microphone 20 may be mounted directly over the aperture 24, or immediately next to it. As another example, as shown in FIG. 4, the microphone 20 may be mounted directly underneath the aperture 24.

To surface mount the circuit chip 22, the process may place solder onto the base pads exposed on the top base surface. Alternatively, the solder is placed onto the chip pads 48. Next, the process positions the circuit chip 22 onto the base 14 so that its chip pads 48 are in direct contact with the solder. A reflow operation melts the solder, consequently electrically and mechanically securing the circuit chip 22 to the base 14. In some embodiments, the process further may add an underfill material beneath the circuit chip 22.

The process continues to step 602, which connects wirebond(s) 40 between the microphone chip and the circuit chip 22. As noted above, in illustrative embodiments, these wirebond(s) 40 are the only electrical contact that the microphone chip 20 has with the base 14. In fact, as also noted above, there may be only one wirebond 40, or many wirebonds between the chips 20 and 22. For example, one could be for positive voltage supply, another for ground, and another to transmit the variable capacitive signal to the base 14 and, ultimately, to an external component. To that end, the process connects the wire bond(s) 40 between a pad on the microphone chip 20 and the top pad(s) 46 on the circuit chip 22. Alternative embodiments, however, may have only one of those wirebonds 40 in the plan region 42.

The process concludes at step 604 by connecting the lid 16 to the base 14. If formed of metal, having a metal layer, or otherwise conductive (e.g., a conductive polymer), illustrative embodiments align the lid 16 so that it contacts a base pad having a specified potential (e.g., ground). This ensures that the lid 16 has a controlled potential that will enhance microphone performance (e.g., help limit electromagnetic interference, EMI). To that end, a conductive adhesive or other means may secure the lid 16 to the base 14. It should be noted that the lid 16 should be carefully positioned and aligned since there is much less clearance from its side walls than many prior art lids.

Although the above discussion discloses various exemplary embodiments of the invention, it should be apparent that those skilled in the art can make various modifications that will achieve some of the advantages of the invention without departing from the true scope of the invention.

What is claimed is:

1. A packaged microphone comprising:
a base having a top face;
a lid coupled to the base and forming an interior;
a MEMS microphone secured to the top face of the base within the interior;
a circuit chip secured to the top face of the base within the interior, the circuit chip having a top surface with a top pad, a bottom surface with a bottom pad, and a via, the bottom pad being electrically connected to the base, the via electrically connecting the top pad with the bottom pad; and
a wire bond connected between the MEMS microphone and the top pad on the circuit chip, the MEMS microphone being electrically connected to the bottom pad and the base through the via,
wherein circuitry is positioned on the top surface of the circuit chip.

2. The packaged microphone as defined by claim 1 wherein the lid and base form an interior area on the top face of the base, the circuit chip forming a circuit chip area of the interior area underneath the circuit chip and a remaining area, the remaining area being the rest of the interior area other than the circuit chip area, the remaining area being substantially free of traces.

3. The packaged microchip as defined by claim 1 wherein the lid and base form an interior area on the top face of the base, the microphone and circuit chip covering more than about 70 percent of the interior area.

4. The packaged microphone as defined by claim 1 wherein no wire bonds extend directly from the top face of the base and the MEMS microphone.

5. The packaged microphone as defined by claim 1 wherein the MEMS microphone electrically connects to the base through the wire bond only.

6. The packaged microphone as defined by claim 1 wherein the circuit chip comprises a plurality of additional vias extending between the top surface and bottom surface of the circuit chip.

7. The packaged microphone as defined by claim 1 wherein the circuit chip and MEMS microphone form a plan region that is generally parallel to the base, the plan region including a space between the circuit chip and MEMS microphone, the wire bond being within the plan region only.

8. A packaged microphone comprising:
a base having a top face;
a lid coupled to the base and forming an interior;
a MEMS microphone secured to the top face of the base within the interior;
a circuit chip having a via and a pad and being within the interior, the via being electrically connected to the base and the pad; and a wire bond connected between the MEMS microphone and the pad on the circuit chip, the MEMS microphone being electrically connected to the base through the via of the circuit chip, wherein the circuit chip has a top surface and a bottom surface, circuitry being positioned on the top surface.

9. The packaged microphone as defined by claim 8 wherein the circuit chip is surface mounted to the base.

10. The packaged microphone as defined by claim 8 wherein the base comprises printed circuit board material.

11. The packaged microphone as defined by claim 8 wherein the lid and base form at least a partial electromagnetic shield about the interior.

12. The packaged microphone as defined by claim 8 wherein the circuit chip is an integrated circuit with a top surface, the pad being on the top surface of the circuit chip and being connected to the wire bond.

13. The packaged microphone as defined by claim 8 wherein one or both the lid and base form an aperture for receiving an input audio signal.

14. The packaged microphone as defined by claim 8 wherein the MEMS microphone electrically connects to the base through the wire bond only.

15. The packaged microphone as defined by claim 8 wherein the lid and base form an interior area on the top face of the base, the circuit chip forming a circuit chip area of the interior area underneath the circuit chip and a remaining area, the remaining area being the rest of the interior area other than the circuit chip area, the remaining area being substantially free of traces.

16. A method comprising:
mounting a MEMS microphone onto the top face of a base formed from circuit board material;
surface mounting an integrated circuit chip onto the top face of the base, the integrated circuit having a top surface with a top pad, a bottom surface with a bottom pad, and a via extending between the top and bottom surfaces, the via being electrically connected to the base through the bottom pad with a surface mount connection, the integrated circuit chip including a circuit chip with circuitry, the circuit chip having a top surface;
mounting the circuitry on the top surface of the circuit chip;
connecting a wire bond between the MEMS microphone and the top pad on the top surface of the integrated circuit chip; and
securing a lid to the base.

17. The method as defined by claim 16 wherein the integrated circuit chip and MEMS microphone form a plan region that is generally parallel to the base, the plan region including a space between the integrated circuit chip and MEMS microphone, the wire bond being within the plan region only.

18. The method as defined by claim 16 wherein securing the lid to the base comprises forming an electromagnetic shield about the MEMS microphone.

19. A packaged microphone comprising:
a base having a top face;
a lid coupled to the base and forming an interior;
a MEMS microphone secured to the top face of the base within the interior;
a circuit chip secured to the top face of the base within the interior, the circuit chip having a top surface with a top pad, a bottom surface with a bottom pad, and a via, the bottom pad being electrically connected to the base, the via electrically connecting the top pad with the bottom pad; and
a wire bond connected between the MEMS microphone and the top pad on the circuit chip, the MEMS microphone being electrically connected to the bottom pad and the base through the via, wherein circuitry is positioned, at least in part, on the bottom surface of the circuit chip.

20. The packaged microphone as defined by claim 19 wherein the lid and base form an interior area on the top face of the base, the circuit chip forming a circuit chip area of the interior area underneath the circuit chip and a remaining area, the remaining area being the rest of the interior area other than the circuit chip area, the remaining area being substantially free of traces.

21. The packaged microchip as defined by claim 19 wherein the lid and base form an interior area on the top face of the base, the microphone and circuit chip covering more than about 70 percent of the interior area.

22. The packaged microphone as defined by claim 19 wherein no wire bonds extend directly from the top face of the base and the MEMS microphone.

23. The packaged microphone as defined by claim 19 wherein the MEMS microphone electrically connects to the base through the wire bond only.

24. The packaged microphone as defined by claim 19 wherein the circuit chip comprises a plurality of additional vias extending between the top surface and bottom surface of the circuit chip.

25. The packaged microphone as defined by claim 19 wherein the circuit chip and MEMS microphone form a plan region that is generally parallel to the base, the plan region including a space between the circuit chip and MEMS microphone, the wire bond being within the plan region only.

26. A packaged microphone comprising:
a base having a top face;
a lid coupled to the base and forming an interior;
a MEMS microphone secured to the top face of the base within the interior;
a circuit chip having a via and a pad and being within the interior, the via being electrically connected to the base and the pad; and
a wire bond connected between the MEMS microphone and the pad on the circuit chip, the MEMS microphone being electrically connected to the base through the via of the circuit chip, wherein the circuit chip has a top surface and a bottom surface, circuitry being positioned, at least in part, on the bottom surface of the circuit chip.

27. The packaged microphone as defined by claim 26 wherein the circuit chip is surface mounted to the base.

28. The packaged microphone as defined by claim 26 wherein the base comprises printed circuit board material.

29. The packaged microphone as defined by claim 26 wherein the lid and base form at least a partial electromagnetic shield about the interior.

30. The packaged microphone as defined by claim 26 wherein the circuit chip is an integrated circuit with a top surface, the pad being on the top surface of the circuit chip and being connected to the wire bond.

31. The packaged microphone as defined by claim 26 wherein one or both the lid and base form an aperture for receiving an input audio signal.

32. The packaged microphone as defined by claim 26 wherein the MEMS microphone electrically connects to the base through the wire bond only.

33. The packaged microphone as defined by claim 26 wherein the lid and base form an interior area on the top face of the base, the circuit chip forming a circuit chip area of the interior area underneath the circuit chip and a remaining area, the remaining area being the rest of the interior area other than the circuit chip area, the remaining area being substantially free of traces.

34. A method comprising:
 mounting a MEMS microphone onto the top face of a base formed from circuit board material;
 surface mounting an integrated circuit chip onto the top face of the base, the integrated circuit having a top surface with a top pad, a bottom surface with a bottom pad, and a via extending between the top and bottom surfaces, the via being electrically connected to the base through the bottom pad with a surface mount connection, the integrated circuit chip including a circuit chip with circuitry, the circuit chip having a bottom surface;
 mounting the circuitry, at least in part, on the bottom surface of the circuit chip;
 connecting a wire bond between the MEMS microphone and the top pad on the top surface of the integrated circuit chip; and
 securing a lid to the base.

35. The method as defined by claim 34 wherein the integrated circuit chip and MEMS microphone form a plan region that is generally parallel to the base, the plan region including a space between the integrated circuit chip and MEMS microphone, the wire bond being within the plan region only.

36. The method as defined by claim 34 wherein securing the lid to the base comprises forming an electromagnetic shield about the MEMS microphone.

\* \* \* \* \*